US010283425B2

(12) United States Patent
Lee

(10) Patent No.: US 10,283,425 B2
(45) Date of Patent: May 7, 2019

(54) TEST KEY AND METHOD FOR MONITORING SEMICONDUCTOR WAFER

(71) Applicant: UNITED MICROELECTRONICS CORP., Hsinchu (TW)

(72) Inventor: Sheng-Chin Lee, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 29 days.

(21) Appl. No.: 15/647,413

(22) Filed: Jul. 12, 2017

(65) Prior Publication Data

US 2019/0019735 A1 Jan. 17, 2019

(51) Int. Cl.
*G01R 31/28* (2006.01)
*H01L 21/66* (2006.01)
*H01L 21/67* (2006.01)

(52) U.S. Cl.
CPC .......... *H01L 22/34* (2013.01); *G01R 31/2831* (2013.01); *G01R 31/2851* (2013.01); *H01L 21/67242* (2013.01)

(58) Field of Classification Search
CPC ................................................ H01L 21/67242
See application file for complete search history.

(56) References Cited

U.S. PATENT DOCUMENTS 5,976,898 A * 11/1999 Marty .................. G01R 31/311 438/12
7,612,371 B2 11/2009 Ahsan et al.

FOREIGN PATENT DOCUMENTS

CN 102709254 A 10/2012

* cited by examiner

*Primary Examiner* — Clayton E. LaBalle
*Assistant Examiner* — Jas A Sanghera
(74) *Attorney, Agent, or Firm* — WPAT, PC

(57) ABSTRACT

A test key and a method for monitoring a semiconductor wafer are disclosed. The test key includes a first testing unit and a second testing unit. The first testing unit has a first diode-to-conductive layer area ratio. The second testing unit has a second diode-to-conductive layer area ratio. The second diode-to-conductive layer area ratio is smaller than the first diode-to-conductive layer area ratio.

14 Claims, 1 Drawing Sheet

TEST KEY AND METHOD FOR MONITORING SEMICONDUCTOR WAFER

BACKGROUND

Technical Field

The disclosure relates to a test key and a method for monitoring a semiconductor wafer by using the same, and more particularly to a test key for testing an arcing or a defect induced from charging during a fabrication process and a method for monitoring an arcing window or a process window of a defect induced from charging during a fabrication process of a semiconductor wafer.

Description of the Related Art

In semiconductor fabrication, a semiconductor device or an integrated circuit (IC) should be continuously tested in every step so as to maintain device quality. Usually, a testing circuit is simultaneously fabricated with an actual device so that quality of the actual device can be judged by a performance of the testing circuit. The quality of the actual device therefore can be well controlled. Typically, such testing circuit, which is also referred to as “test key”, is disposed on peripheral area of each chip or die.

SUMMARY

According to an embodiment, a test key is disclosed. The test key comprises a first testing unit and a second testing unit. The first testing unit has a first diode-to-conductive layer area ratio. The second testing unit has a second diode-to-conductive layer area ratio. The second diode-to-conductive layer area ratio is smaller than the first diode-to-conductive layer area ratio.

According to another embodiment, a method for monitoring a semiconductor wafer is disclosed. The method comprises the following steps. A test key is provided. The test key comprises testing units having different diode-to-conductive layer area ratios. A testing step is performed. The testing step comprises using the test key to test the semiconductor wafer.

Figure 1:
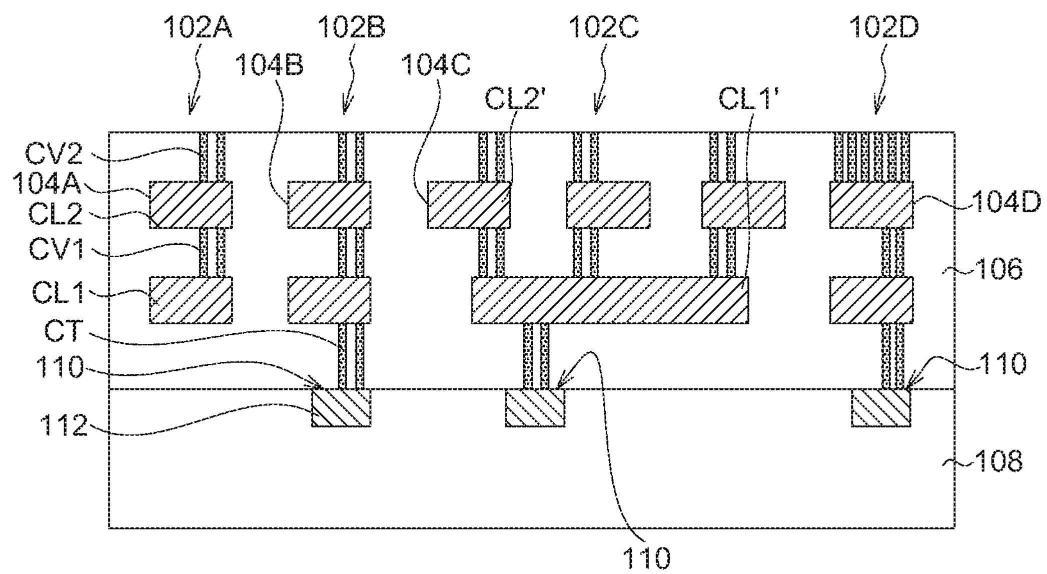
FIG. 1 is a schematic drawing of a test key according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

According to embodiments, a test key comprising testing units having different diode-to-conductive layer area ratios is provided. The test key may be used for monitoring a semiconductor wafer to obtain a design rule of process window.

Embodiments are provided hereinafter with reference to the accompanying drawings for describing the related procedures and configurations. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

FIG. 1 is a schematic drawing illustrating testing units 102A, 102B, 102C, 102D of a test key according to an embodiment.

The testing unit 102A may comprise a conductive layer 104A comprising a sub conductive layer CL1 and a sub conductive layer CL2, and conductive vias CV1 and conductive vias CV2, electrically connected to each other and formed in a dielectric layer 106 on a semiconductor substrate 108. The conductive layer 104A of the testing unit 102A floats from the semiconductor substrate 108 since there is no electrical connecting element (such as a contact) between the sub conductive layer CL1 and the semiconductor substrate 108. A diode-to-conductive layer area ratio of the testing unit 102A is zero since the conductive layer 104A of which electrically connects to no diode unit, in other words, an area of diode unit of the testing unit 102A is zero.

The testing unit 102B may be different from the testing unit 102A in that a conductive layer 104B of the testing unit 102B electrically connects to a diode unit, and has a diode-to-conductive layer area ratio larger than the diode-to-conductive layer area ratio of the testing unit 102A. Specifically, as shown in FIG. 1, the testing unit 102B may further comprise a diode unit 110 and contacts CT electrically connected between the sub conductive layer CL1 and the diode unit 110. The diode unit 110 comprises a doped region 112 formed by doping the semiconductor substrate 108. The doped region 112 has one of a p-type conductivity and a n-type conductivity, and the semiconductor substrate 108 has the other of the p-type conductivity and the n-type conductivity. The doped region 112 of the diode unit 110 may comprise a metal silicide formed on an upper surface of which. A diode-to-conductive layer area ratio of the testing unit 102B may be calculated by dividing an area of the doped region 112 of the diode unit 110 by an area of the conductive layer 104B. The area of the conductive layer 104B may be a total area of the sub conductive layer CL1 and the sub conductive layer CL2.

The testing unit 102C may be different from the testing unit 102B in that the testing unit 102C has a diode-to-conductive layer area ratio smaller than the diode-to-conductive layer area ratio of the testing unit 102B. For example, in an embodiment, the doped regions 112 of the diode units 110 of the testing unit 102B and the testing unit 102C may have the same area, but a conductive layer 104C of the testing unit 102C may have a larger area than the conductive layer 104B of the testing unit 102B. For example, the conductive layer 104C of the testing unit 102C may comprise a sub conductive layer CL1' and sub conductive layers CL2', electrically connected to the diode unit 110 through the conductive vias CV1, CV2 and the contacts CT. The sub conductive layer CL1' of the testing unit 102C may have a larger area than the sub conductive layer CL1 of the testing unit 102B in the same level, such as a first metal (M1) level. The sub conductive layers CL2' of the testing unit 102C may have a larger area than the sub conductive layer CL2 of the testing unit 102B in the same level, such as a second metal (M2) level. A total area of sub conductive layers CL1' and CL2' of the testing unit 102C may be larger than a total area of sub conductive layers CL1 and CL2 of the testing unit 102B.

The testing unit 102D may have a quantity of conductive vias different from that of the testing unit 102B. For example, as shown in FIG. 1, a quantity of the conductive vias CV2 on the sub conductive layer CL2 of the testing unit 102D is more than a quantity of the conductive vias CV2 of on the sub conductive layer CL2 of the testing unit 102B. Therefore, a voltage applied to the testing unit 102D through the conductive vias CV2 could form an electrical potential in a conductive layer 104D more efficiently.

The test key according to embodiments is not limited to the forgoing testing units 102A, 102B, 102C, and 102D. In other embodiment, for example, the conductive layer, the contact, and/or the conductive via may comprise a metal, a polysilicon, or other suitable conductive materials. The conductive layer may comprise a sub conductive layer in another level, such as a level of a third metal (M3), etc. The conductive layer may have at least one sub conductive layer in only one level, such as the level of M1, M2, etc. The conductive layer in one level may have only one sub conductive layer or a plurality of the sub conductive layers separated from each other by the dielectric layer. The contact and/or the conductive via may be varied in quantity properly. The test key may be manufactured by a method compatible with a process flow for other semiconductor devices formed on the semiconductor substrate of a semiconductor wafer. Therefore, the test key may be manufactured with process for the semiconductor devices without an additional manufacturing cost and additional forming steps.

The semiconductor wafer may be tested by a testing step with using the test key according to embodiments to monitor an arcing window for the semiconductor wafer or a process window of a defect induced from charging during a fabrication process of a semiconductor wafer. The testing step may comprises individually using the testing units of the test key according to embodiments to test the semiconductor wafer with a sequence of decreasing diode-to-conductive layer area ratio until the semiconductor wafer is damaged by arcing so as to obtain a design rule of process window.

Figure 2:
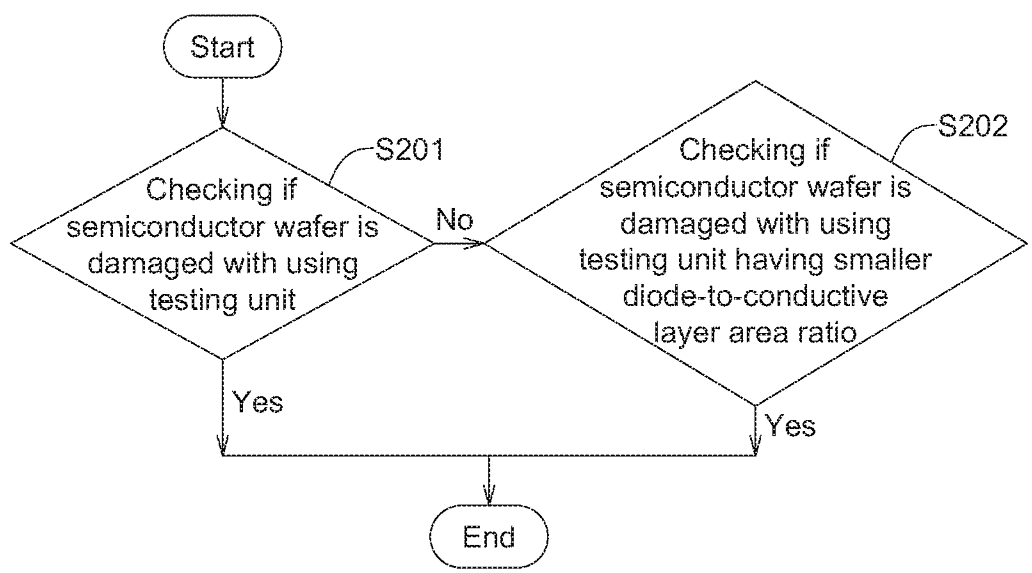
FIG. 2 illustrates a method for monitoring a semiconductor wafer according to an embodiment.

FIG. 2 illustrates a method for monitoring the semiconductor wafer. In a step S201, for example, after a voltage is applied to the testing unit 102B through a conductive pad (not shown) electrically connected to the conductive vias CV2 of the testing unit 102B, the semiconductor wafer may be checked if damage occurs therein due to an arcing phenomenon resulted from the applied voltage. If it is monitored that damage occurs therein, the diode-to-conductive layer area ratio of the testing unit 102B may be referred to as a spec diode-to-conductive layer area ratio and used for defining a design rule of process window. If it is monitored that no damage occurs due to the applied voltage, a step S202 is performed.

In the step S202, for example, after a voltage (which may be the same as the voltage applied to the testing unit 102B in the step S201) is applied to the testing unit 102C through a conductive pad (not shown) electrically connected to the conductive vias CV2 of the testing unit 102C, the semiconductor wafer may be checked if damage occurs therein due to an arcing phenomenon resulted from the applied voltage. Similarly, if it is monitored that damage occurs due to the applied voltage, the diode-to-conductive layer area ratio of the testing unit 102C may be referred to as a spec diode-to-conductive layer area ratio and used for defining a design rule of process window. If it is monitored that no damage occurs due to the applied voltage, another step with using another testing unit having a smaller diode-to-conductive layer area ratio than that of the testing unit 102C is performed, and so forth. In other embodiments, the testing unit 102A having the smaller diode-to-conductive layer area ratio than that of the testing unit 102B may be used in the step S202, and so forth.

According to embodiments, a test key comprising testing units having different diode-to-conductive layer area ratios is provided. The testing units of the test key may be individually used with a sequence of decreasing diode-to-conductive layer area ratio for testing and monitoring the semiconductor wafer to obtain a design rule of process window, for example an arcing window for the semiconductor wafer.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A test key, comprising:

a first testing unit having a first diode-to-conductive layer area ratio, wherein the first testing unit comprises a first conductive layer and at least one first conductive via electrically connected to the first conductive layer; and a second testing unit having a second diode-to-conductive layer area ratio smaller than the first diode-to-conductive layer area ratio, wherein the second testing unit comprises a second conductive layer and at least one second conductive via electrically connected to the second conductive layer, a quantity of the at least one first conductive via is different from a quantity of the at least one second conductive via.

2. The test key according to claim 1, wherein an area of the first conductive layer is smaller than an area of the second conductive layer.

3. The test key according to claim 2, wherein the area of the first conductive layer in one level is smaller than the area of the second conductive layer in one level.

4. The test key according to claim 2, wherein each of the first conductive layer and the second conductive layer comprises at least one sub conductive layer, a total area of the at least one sub conductive layer of the first conductive layer is smaller than a total area of the at least one sub conductive layer of the second conductive layer.

5. The test key according to claim 2, comprising a dielectric layer, wherein at least one of the first conductive layer and the second conductive layer comprises a plurality of the sub conductive layers separated from each other by the dielectric layer.

6. The test key according to claim 1, wherein each of the first testing unit and the second testing unit comprises a conductive layer and a diode unit electrically connected to each other, the first diode-to-conductive layer area ratio and the second diode-to-conductive layer area ratio are calculated based on areas of doped regions of the diode units and the conductive layer of the first testing unit and the second testing unit, respectively.

7. The test key according to claim 6, wherein each of the first testing unit and the second testing unit further comprises a contact electrically connected between the conductive layer and the diode unit, the doped regions of the diode units are in contact with the contacts and have one of a p-type conductivity and a n-type conductivity.

8. The test key according to claim 6, comprising a semiconductor substrate, wherein the doped regions of the diode units are in the semiconductor substrate, the conductive layers are on the semiconductor substrate.

9. The test key according to claim 1, wherein the quantity of the at least one first conductive via in contact with the same first conductive layer is different from the quantity of the at least one second conductive via in contact with the same second conductive layer.

10. The test key according to claim 1, wherein the at least one first conductive via is disposed on the first conductive layer, the least one second conductive via is disposed on the second conductive layer.

11. A method for monitoring a semiconductor wafer, comprising:

providing a test key comprising testing units having different diode-to-conductive layer area ratios; and a testing step comprising individually providing a voltage to the testing units of the test key to test the semiconductor wafer with a sequence of decreasing diode-to-conductive layer area ratio until the semiconductor wafer is damaged.

12. The method for monitoring the semiconductor wafer according to claim 11, wherein the semiconductor wafer is damaged after being tested with one of the testing units, the one of the testing units has a spec diode-to-conductive layer area ratio, the method further comprises using the spec diode-to-conductive layer area ratio for defining a design rule of process window.

13. The method for monitoring the semiconductor wafer according to claim 11, wherein the semiconductor wafer is damaged by an arcing phenomenon.

14. The method for monitoring the semiconductor wafer according to claim 11, wherein the test key comprises:

a first testing unit having a first diode-to-conductive layer area ratio; and a second testing unit having a second diode-to-conductive layer area ratio smaller than the first diode-to-conductive layer area ratio, wherein the testing step comprises:

providing the voltage to the first testing unit to test the semiconductor wafer; and then providing the voltage to the second testing unit to test the semiconductor wafer.

* * * * *